(12) United States Patent
Kim et al.

(10) Patent No.: US 12,342,618 B2
(45) Date of Patent: Jun. 24, 2025

(54) DISPLAY DEVICE WITH ASYMMETRIC INSULATING PATTERN

(71) Applicant: SAMSUNG DISPLAY CO., LTD., Yongin-si (KR)

(72) Inventors: Hyoeng-Ki Kim, Suwon-si (KR); Hyeon-Bum Lee, Hwaseong-si (KR); Kwang-Woo Park, Hwaseong-si (KR); Jin-Whan Jung, Yesan-Gun Chungcheongnam-do (KR); Jong-Beom Hong, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 832 days.

(21) Appl. No.: 17/612,111

(22) PCT Filed: Jan. 17, 2020

(86) PCT No.: PCT/KR2020/000845
§ 371 (c)(1),
(2) Date: Nov. 17, 2021

(87) PCT Pub. No.: WO2020/256248
PCT Pub. Date: Dec. 24, 2020

(65) Prior Publication Data
US 2022/0254850 A1    Aug. 11, 2022

(30) Foreign Application Priority Data

Jun. 17, 2019    (KR) .................... 10- 2019- 0071856

(51) Int. Cl.
*H10D 86/40*    (2025.01)
*H10K 59/124*    (2023.01)
(Continued)

(52) U.S. Cl.
CPC ......... *H10D 86/411* (2025.01); *H10K 59/124* (2023.02); *H10K 59/131* (2023.02);
(Continued)

(58) Field of Classification Search
CPC .... H10K 59/124; H10K 50/865; H10K 59/35; H10K 59/38; H10K 77/111;
(Continued)

(56) References Cited

U.S. PATENT DOCUMENTS 9,269,924 B2    2/2016    Nozawa et al.
10,672,848 B2    6/2020    Lee et al.
(Continued)

FOREIGN PATENT DOCUMENTS

CN    104244485 A    12/2014
CN    109166862    1/2019
(Continued)

OTHER PUBLICATIONS

Extended European Search Report dated Jul. 3, 2023 in corresponding EP Application No. 20826531.4.
(Continued)

*Primary Examiner* — Mohammad M Hoque
(74) *Attorney, Agent, or Firm* — F. CHAU & ASSOCIATES, LLC

(57) ABSTRACT

A display device includes a base substrate which is flexible, first and second active patterns disposed on the base substrate, an inorganic insulating layer disposed on the first and second active patterns and defining an opening area, a first organic insulating pattern disposed inside the opening area, a bridge electrode disposed on the first organic insulating pattern, a second organic insulating layer disposed on the bridge electrode, a fourth organic insulating layer disposed on the second organic insulating layer, first and second pixel electrodes disposed on the fourth organic insulating layer (Continued)

and electrically connected to the first and second active patterns, respectively, and a third organic insulating pattern disposed between the second organic insulating layer and the fourth organic insulating layer, overlapping the second pixel electrode, and not overlapping the first pixel electrode.

20 Claims, 8 Drawing Sheets

(51) Int. Cl.
  *H10K 59/131* (2023.01)
  *H10K 59/80* (2023.01)
  *H10K 50/86* (2023.01)
  *H10K 59/35* (2023.01)
  *H10K 59/38* (2023.01)
  *H10K 77/10* (2023.01)
  *H10K 102/00* (2023.01)

(52) U.S. Cl.
  CPC ......... *H10K 59/873* (2023.02); *H10K 50/865* (2023.02); *H10K 59/35* (2023.02); *H10K 59/38* (2023.02); *H10K 59/8792* (2023.02); *H10K 77/111* (2023.02); *H10K 2102/311* (2023.02)

(58) Field of Classification Search
  CPC ......... H10K 2102/311; H10K 59/8792; H10K 59/131; H10K 59/873; H01L 27/1248; H01L 27/1218
  USPC .......................................................... 257/72
  See application file for complete search history.

(56) References Cited

U.S. PATENT DOCUMENTS

| | | | |
|---|---|---|---|
| 2012/0104396 | A1 | 5/2012 | Pyo |
| 2013/0302923 | A1 | 11/2013 | Park et al. |
| 2015/0236081 | A1* | 8/2015 | Kim ................... H10K 59/1213 |
| | | | 257/40 |
| 2016/0190213 | A1 | 6/2016 | Kim et al. |
| 2018/0122861 | A1 | 5/2018 | Shim et al. |
| 2018/0180951 | A1* | 6/2018 | Toyotaka ............. H10K 59/122 |
| 2019/0006449 | A1* | 1/2019 | Wu ........................ H10D 84/83 |
| 2019/0131355 | A1 | 5/2019 | Chae |
| 2019/0140202 | A1 | 5/2019 | Jin et al. |
| 2019/0148476 | A1 | 5/2019 | Park et al. |
| 2019/0165060 | A1* | 5/2019 | Choi .................... H10K 50/844 |

FOREIGN PATENT DOCUMENTS

| | | | |
|---|---|---|---|
| JP | 2018106970 A | | 7/2018 |
| KR | 20160088488 A | * | 7/2016 |
| KR | 1020160088488 | | 7/2016 |
| KR | 1020180006534 | | 1/2018 |
| KR | 1020180051318 | | 5/2018 |
| KR | 1020190060190 | | 6/2019 |
| KR | 1020190061699 | | 6/2019 |
| TW | 201904103 A | | 1/2019 |

OTHER PUBLICATIONS

Office Action dated Aug. 21, 2024 from the Korean Intellectual Property Office (KIPO) issued in corresponding Korean Patent Application No. 10-2019-0071856.

Chinese Office Action dated Oct. 16, 2024 from the Chinese Patent Office for Chinese Patent Application No. 202080044269.3.

* cited by examiner

DISPLAY DEVICE WITH ASYMMETRIC INSULATING PATTERN

CROSS-REFERENCE TO RELATED APPLICATIONS

The present application is a National Stage application, filed under 35 U.S.C. § 371, of International Patent Application No. PCT/KR2020/000845, filed on Jan. 17, 2020, which claims priority to Korean Patent Application No. KR 10-2019-0071856, filed on Jun. 17, 2019, the contents of which are incorporated by reference herein in their entirety.

TECHNICAL FIELD

The present invention relates to a display device. More particularly, the present invention relates to a flexible display device having an improved display quality.

DISCUSSION OF RELATED ART

Recently, with the development of technologies, display products with smaller sizes, lighter weights, and better performance are being produced. A conventional cathode ray tube (CRT) television has been widely used as a display device with many advantages in terms of performance and price. However, display devices that overcome disadvantages of a CRT in terms of miniaturization or portability and have advantages such as miniaturization, a lightweight characteristic, and low power consumption, for example, a plasma display device, a liquid crystal display device, an organic light emitting display device, and the like are being spotlighted.

An organic light emitting display (OLED) element may be configured such that holes provided from an anode and electrons provided from a cathode are combined in a light emitting layer disposed between the anode and the cathode to emit a light. When the OLED element is used, a display device having a wide viewing angle, a fast response speed, a thin thickness, and low power consumption may be implemented.

Recently, technologies for implementing a flexible display device that may be bent have been developed by using the OLED element. Since the flexible display device has a complex structure as compared with a general display device (rigid), display quality may deteriorate.

SUMMARY

An object of the present invention is to provide a display device having an improved display quality.

According to an aspect of embodiments, a display device may include a base substrate which is flexible, first and second active patterns disposed on the base substrate, an inorganic insulating layer disposed on the first and second active patterns and defiling an opening area, a first organic insulating pattern disposed inside the opening area, a bridge electrode disposed on the first organic insulating pattern, a second organic insulating layer disposed on the bridge electrode, a fourth organic insulating layer disposed on the second organic insulating layer, first and second pixel electrodes disposed on the fourth organic insulating layer and electrically connected to the first and second active patterns, respectively, and a third organic insulating pattern disposed between the second organic insulating layer and the fourth organic insulating layer, overlapping the second pixel electrode, and not overlapping the first pixel electrode.

In embodiments, the display device may further include a third active pattern disposed on the base substrate, and a third pixel electrode disposed on the fourth organic insulating layer and electrically connected to the third active pattern. In addition, the third organic insulating pattern may not overlap the third pixel electrode.

In embodiments, the first pixel electrode may correspond to a red sub-pixel, the second pixel electrode may correspond to a green sub-pixel, and the third pixel electrode may correspond to a blue sub-pixel.

In embodiments, the display device may further include a third active pattern disposed on the base substrate, and a third pixel electrode disposed on the fourth organic insulating layer and electrically connected to the third active pattern. In addition, the third organic insulating pattern may overlap the third pixel electrode.

In embodiments, the first pixel electrode may correspond to a green sub-pixel, the second pixel electrode may correspond to a red sub-pixel, and the third pixel electrode may correspond to a blue sub-pixel.

In embodiments, when viewed in a plan view, the inorganic insulating layer may be partitioned by the opening area to correspond to a plurality of sub-pixels.

In embodiments, when viewed in a plan view, the opening area may have a lattice shape.

In embodiments, the display device may further include a pixel defiling layer disposed on the fourth organic insulating layer, a light emitting layer disposed on the first pixel electrode, and a counter electrode disposed on the light emitting layer.

In embodiments, the display device may further include a thin film encapsulation layer disposed on the counter electrode, and a color filter layer disposed on the thin film encapsulation layer.

In embodiments, the first pixel electrode and the first active pattern may be included in a pixel circuit of a first sub-pixel, the second pixel electrode and the second active pattern may be included in a pixel circuit of a second sub-pixel, and the bridge electrode may electrically connect the first sub-pixel and the second sub-pixel to each other.

In embodiments, the inorganic insulating layer may include a buffer layer disposed on the base substrate, a gate insulating layer disposed on the buffer layer, and a plurality of inorganic insulating layers disposed on the gate insulating layer.

In embodiments, the display device may further include first and second gate electrodes disposed on the gate insulating layer and overlapping the first and second active patterns, respectively, a first inorganic insulating layer disposed on the gate insulating layer, a first conductive pattern disposed on the first inorganic insulating layer, a second inorganic insulating layer disposed on the first conductive pattern, a second conductive pattern disposed on the second inorganic insulating layer, a third inorganic insulating layer disposed on the second conductive pattern, a third conductive pattern disposed on the third inorganic insulating layer, an insulating layer disposed on the third conductive pattern, and a fourth conductive pattern disposed on the insulating layer. In addition, the first to third inorganic insulating layers may be included in the inorganic insulating layer. Further, the third organic insulating pattern and the fourth organic insulating layer may be disposed between the fourth conductive pattern and the second pixel electrode.

In embodiments, the bridge electrode may be included in the third conductive pattern.

In embodiments, the third organic insulating pattern may include a siloxane-based resin, and the fourth organic insulating layer may include a polyimide-based resin.

In embodiments, the third organic insulating pattern and the fourth organic insulating layer may include a same material.

In embodiments, the display device may further include a light blocking part overlapping the opening area of the inorganic insulating layer.

In embodiments, the display device may further include an insulating layer disposed between the second organic insulating layer and the inorganic insulating layer, covering the bridge electrode, and including an organic insulating material.

In embodiments, the base substrate may include a display area for displaying an image and a peripheral area surrounding the display area. In addition, a bending opening may be formed in the peripheral area by partially removing the inorganic insulating layer, and the first organic insulating pattern may be disposed inside the bending opening.

According to another aspect of embodiments, a display device including a first sub-pixel, a second sub-pixel, and a third sub-pixel, which are configured to emit different color lights, may include a base substrate which is flexible, first to third pixel circuits disposed on the base substrate, first to third pixel electrodes electrically connected to the first to third pixel circuits, respectively, and a plurality of inorganic insulating layers and a plurality of organic insulating layers, which are disposed between the base substrate and the first to third pixel electrodes. Here, when viewed in a plan view, an opening area, which is an area in which the inorganic insulating layer is not formed, may be formed between the first to third pixel electrodes, and the organic insulating layer may be disposed inside the opening area. In addition, a number of the organic insulating layers disposed between the second pixel electrode and the base substrate may be different from a number of the organic insulating layers disposed between the first or third pixel electrode and the base substrate.

In embodiments, the display device may further include a bridge electrode overlapping the opening area. In addition, the bridge electrode may electrically connect two adjacent pixel circuits to each other.

According to embodiments of the present invention, the display device may have an asymmetric structure in which a third organic insulating pattern is disposed under a pixel electrode corresponding to at least one sub-pixel, and the third organic insulating pattern is not disposed under a pixel electrode corresponding to at least one another sub-pixel, so that a reflective color band having a specific color can be prevented from occurring.

In addition, an opening area for stress relaxation may be formed in an inorganic insulating layer, and the opening area may be filled with a layer including an organic insulating material, so that a crack or a tear can be prevented from being caused by stress in the inorganic insulating layer.

However, effects of the present invention are not limited to the above effects, and may be variously extended without departing from the spirit and scope of the present invention.

DETAILED DESCRIPTION

Hereinafter, embodiments of the present invention will be explained in detail with reference to the accompanying drawings.

Figure 1:
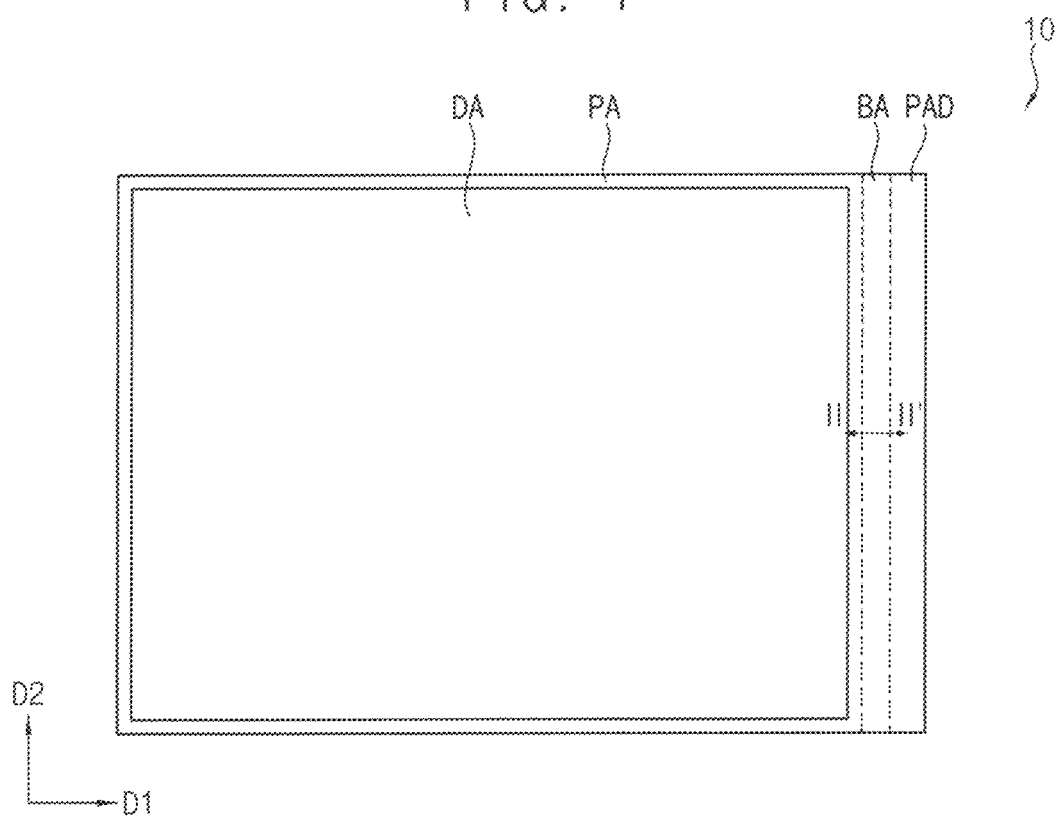
FIG. 1 is a plan view showing a display device according to embodiments of the present invention.

FIG. 1 is a plan view showing a display device according to embodiments of the present invention.

Referring to FIG. 1, a display device 10 may include a display area DA for displaying an image, and a peripheral area PA surrounding the display area. The peripheral area PA may include a bending area BA in which the display device 10 is bent, and a pad area PAD to which an external driver is connected.

Figure 2:
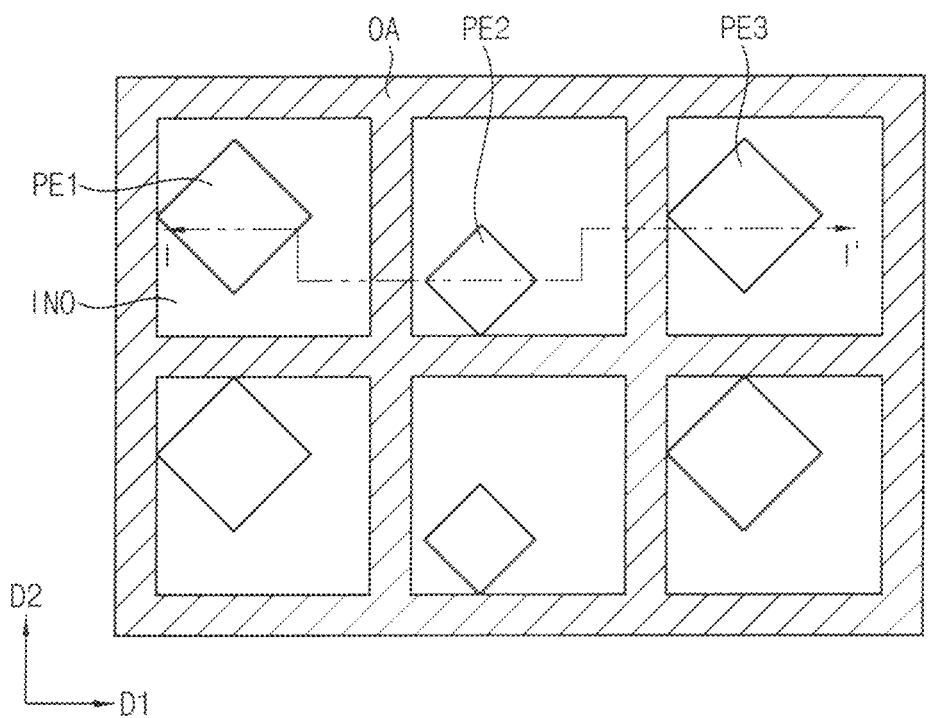
FIG. 2 is a partially enlarged view showing portions of sub-pixels in a display area of the display device of FIG. 1.
Figure 3:
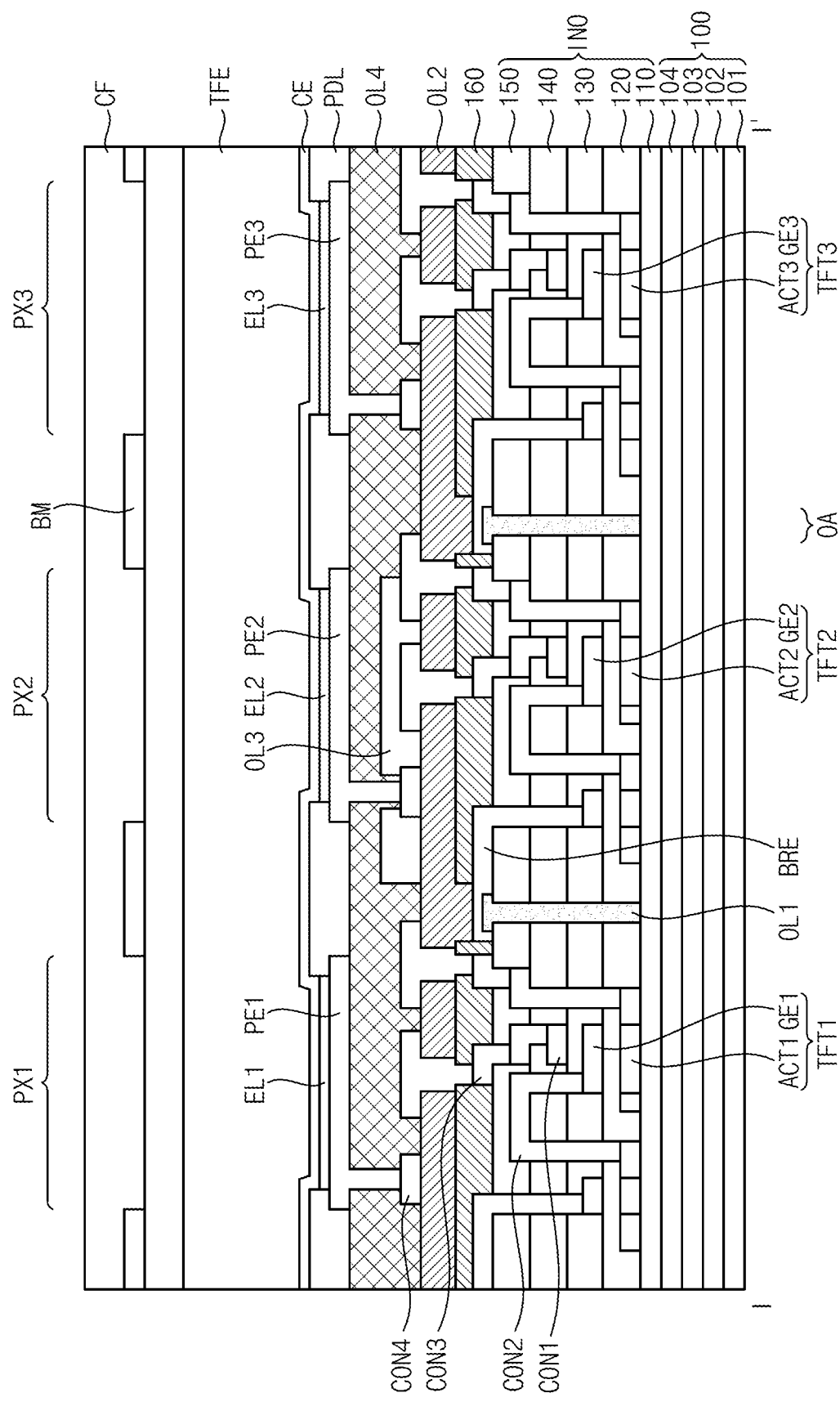
FIG. 3 is a cross-sectional view taken along line I-I' in FIG. 2.
Figure 4:
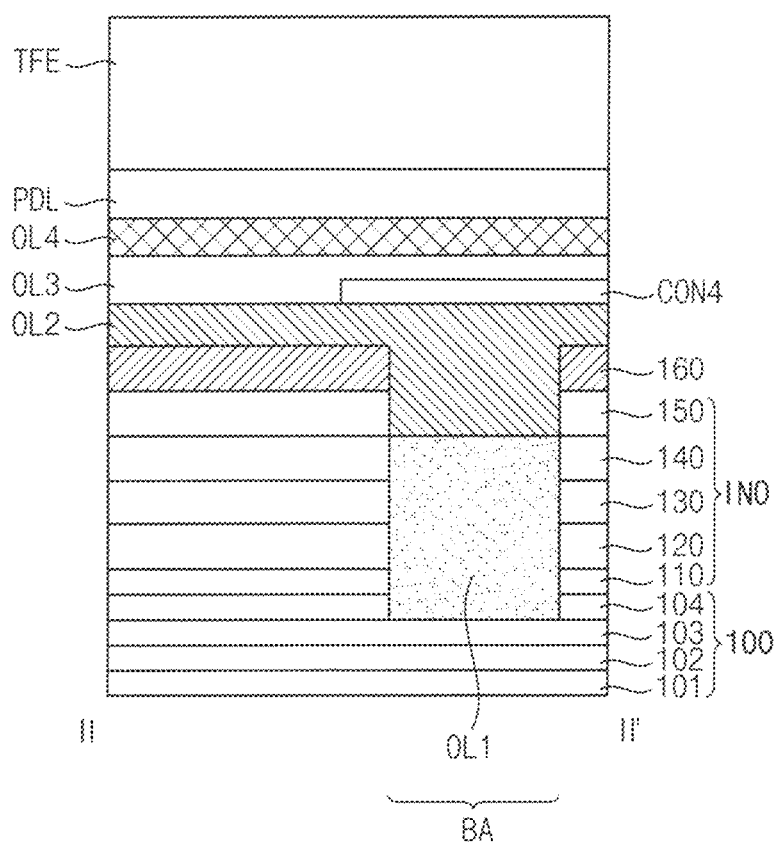
FIG. 4 is a cross-sectional view taken along line II-II' in FIG. 1.

FIG. 2 is a partially enlarged view showing portions of sub-pixels in a display area of the display device of FIG. 1, FIG. 3 is a cross-sectional view taken along line I-I' in FIG. 2, and FIG. 4 is a cross-sectional view taken along line II-II' in FIG. 1.

Referring to FIGS. 2 to 4, the display device may include a plurality of sub-pixels arranged in a matrix form in a first direction D1 and a second direction D2 intersecting the first direction D1. For example, the sub-pixels may include a first sub-pixel PX1, a second sub-pixel PX2, and a third sub-pixel PX3, and the first to third sub-pixels may be a red sub-pixel, a green sub-pixel, and a blue sub-pixel, respectively.

Pixel circuits corresponding to the sub-pixels, respectively, may be formed. An inorganic insulating layer INO, which will be described below, may be partitioned by an opening area OA, which is filled with a first organic insulating pattern OL1, to correspond to each of the sub-pixels.

In other words, the opening area OA may have a lattice shape in the first direction D1 and the second direction D2 when viewed in a plan view.

Signal wires crossing the pixel circuits, for example, scan signal lines and data signal lines, may be formed to cross the pixel circuits through a bridge electrode BRE.

Referring again to FIG. 3, in the display area DA, the display device may include a base substrate 100, a buffer layer 110, first to third active patterns ACT1, ACT2, and ACT3, a gate insulating layer 120, a gate electrode layer, a first inorganic insulating layer 130, a first conductive pattern CON1, a second inorganic insulating layer 140, a second conductive pattern CON2, a third inorganic insulating layer 150, a third conductive pattern CON3, a first organic insulating pattern OL1, an insulating layer 160, a fourth conductive pattern CON4, a second organic insulating layer OL2, a third organic insulating pattern OL3, a fourth organic insulating layer OL4, a first pixel electrode PE1, a second pixel electrode PE2, a third pixel electrode PE3, a pixel defiling layer PDL, a first light emitting layer EL1, a second light emitting layer EL2, a third light emitting layer EL3, a counter electrode CE, a thin film encapsulation layer TFE, a light blocking part BM, and a color filter layer CF.

The base substrate 100 may include a flexible substrate. The base substrate 100 may be implemented to have a curved surface, and may include a transparent insulating material suitable for supporting stacked conductive patterns and layers. For example, the base substrate 100 may include polyimide, polycarbonate, polyethylene, and the like. For example, the base substrate 100 may have a stacked structure including a first polyimide layer 101, a first barrier layer 102 disposed on the first polyimide layer 101, a second polyimide layer 103 disposed on the first bather layer 102, and a second bather layer 104 disposed on the second polyimide layer 103.

The buffer layer 110 may be disposed on the base substrate 100. The buffer layer 110 may provide a flat surface on a top surface of the base substrate 100, and prevent water or impurities from diffusing. The buffer layer 110 may include an inorganic insulating material. The buffer layer 110 may include an inorganic insulating material such as a silicon compound and metal oxide.

The first to third active patterns ACT1, ACT2, and ACT3 may be disposed on the buffer layer 110.

The first to third active patterns ACT1, ACT2, and ACT3 may include amorphous silicon, polycrystalline silicon, and the like. In another embodiment, the first to third active patterns ACT1, ACT2, and ACT3 may include an oxide semiconductor. Each of the first to third active patterns ACT1, ACT2, and ACT3 may include drain and source regions doped with impurities, and a channel region disposed between the drain region and the source region.

The gate insulating layer 120 may be disposed on the buffer layer 110 on which the first to third active patterns ACT1, ACT2, and ACT3 are disposed. The gate insulating layer 120 may include an inorganic insulating material such as a silicon compound and metal oxide.

The gate electrode layer may be disposed on the gate insulating layer 120. The gate electrode layer may include a first gate electrode GE1, a second gate electrode GE2, and a third gate electrode GE3. The first gate electrode GE1 may overlap the channel region of the first active pattern ACT1. The second gate electrode GE2 may overlap the channel region of the second active pattern ACT2. The third gate electrode GE3 may overlap the channel region of the third active pattern ACT3. The gate electrode layer may be formed by using a metal, an alloy, metal nitride, conductive metal oxide, a transparent conductive material, and the like.

The first active pattern ACT1 and the first gate electrode GE1 may be included in a first thin film transistor TFT1 constituting a pixel circuit of the first sub-pixel PX1. The second active pattern ACT2 and the second gate electrode GE2 may be included in a second thin film transistor TFT2 constituting a pixel circuit of the second sub-pixel PX2. The third active pattern ACT3 and the third gate electrode GE3 may be included in a third thin film transistor 1113 constituting a pixel circuit of the third sub-pixel PX3.

Each of the first to third thin film transistors may be a thin film transistor having a top-gate structure. However, the above embodiment has been provided for illustrative purposes, so the structure of the thin film transistor is not limited thereto. For example, the thin film transistor may be a thin film transistor having a bottom-gate structure.

The first inorganic insulating layer 130 may be disposed on the gate insulating layer 120 on which the gate electrode layer is disposed. The first inorganic insulating layer 130 may include an inorganic insulating material such as a silicon compound and metal oxide.

The first conductive pattern CON1 may be disposed on the first inorganic insulating layer 130. The first conductive pattern CON1 may constitute a portion of the pixel circuit. The first conductive pattern CON1 may be formed by using a metal, an alloy, metal nitride, conductive metal oxide, a transparent conductive material, and the like.

The second inorganic insulating layer 140 may be disposed on the first inorganic insulating layer 130 on which the first conductive pattern CON1 is disposed. The second inorganic insulating layer 140 may include an inorganic insulating material such as a silicon compound and metal oxide.

The second conductive pattern CON2 may be disposed on the second inorganic insulating layer 140. The second conductive pattern CON2 may constitute a portion of the pixel circuit. The second conductive pattern CON2 may be formed by using a metal, an alloy, metal nitride, conductive metal oxide, a transparent conductive material, and the like.

The third inorganic insulating layer 150 may be disposed on the second inorganic insulating layer 140 on which the second conductive pattern CON2 is disposed. The third inorganic insulating layer 150 may include an inorganic insulating material such as a silicon compound and metal oxide.

In this case, the buffer layer 110, the gate insulating layer 120, the first inorganic insulating layer 130, the second inorganic insulating layer 140, and the third inorganic insulating layer 150 may be included in the inorganic insulating layer INO.

An opening area OA may be formed in the inorganic insulating layer INO. The opening area OA may overlap the pixel defiling layer PDL and the light blocking part BM, and the opening area OA may be partially or completely filled with the first organic insulating pattern OL1.

The first organic insulating pattern OL1 may be disposed inside the opening area OA of the inorganic insulating layer INO. The first organic insulating pattern OL1 may be formed by using an organic insulating material such as a photoresist, an acryl-based resin, a polyimide-based resin, a polyamide-based resin, and a siloxane-based resin.

When the display device 10 that is flexible is bent, stress may be caused by a compressive force or a tensile force in the inorganic insulating layer INO including the inorganic insulating material. The opening area OA for stress relaxation may be formed in the inorganic insulating layer INO, and the opening area OA may be filled with the first organic insulating pattern OL1 including the organic insulating material. Therefore, a crack or a tear may be prevented from being caused by the stress in the inorganic insulating layer INO.

The third conductive pattern CON3 may be disposed on the inorganic insulating layer INO and the first organic insulating pattern OL1. The third conductive pattern CON3 may constitute a portion of the pixel circuit. The third conductive pattern CON3 may include the bridge electrode BRE. The third conductive pattern CON3 may be formed by using a metal, an alloy, metal nitride, conductive metal oxide, a transparent conductive material, and the like.

The insulating layer 160 may be disposed on the inorganic insulating layer INO on which the third conductive pattern CON3 is disposed. The insulating layer 160 may include an inorganic or organic insulating material. For example, the insulating layer 160 may include a siloxane-based resin.

The second organic insulating layer OL2 may be disposed on the insulating layer 160. The second organic insulating layer OL2 may be formed by using an organic insulating material such as a photoresist, an acryl-based resin, a polyimide-based resin, a polyamide-based resin, and a siloxane-based resin.

The fourth conductive pattern CON4 may be disposed on the second organic insulating layer OL2. The fourth conductive pattern CON4 may constitute a portion of the pixel circuit. The fourth conductive pattern CON4 may be formed by using a metal, an alloy, metal nitride, conductive metal oxide, a transparent conductive material, and the like.

The third organic insulating pattern OL3 may be disposed on the second organic insulating layer OL2 on which the fourth conductive pattern CON4 is disposed. The third organic insulating pattern OL3 may be formed to correspond to the second sub-pixel PX2. In other words, the third organic insulating pattern OL3 may be formed only in a portion overlapping the second pixel electrode PE2, and may not overlap the first and third pixel electrodes PE1 and PE3.

The third organic insulating pattern OL3 may be formed by using an organic insulating material such as a photoresist, an acryl-based resin, a polyimide-based resin, a polyamide-based resin, and a siloxane-based resin. For example, the third organic insulating pattern OL3 may include a siloxane-based resin.

The fourth organic insulating layer OL4 may be disposed on the second organic insulating layer OL2 on which the third organic insulating pattern OL3 and the fourth conductive pattern CON4 are disposed. The fourth organic insulating layer OL4 may be formed by using an organic insulating material such as a photoresist, an acryl-based resin, a polyimide-based resin, a polyamide-based resin, and a siloxane-based resin. For example, the fourth organic insulating layer OL4 may include a polyimide-based resin. In this case, although the third organic insulating pattern OL3 and the fourth organic insulating layer OL4 have been described as including mutually different materials, the embodiments are not limited thereto, and the third organic insulating pattern OL3 and the fourth organic insulating layer OL4 may include the same material.

The first pixel electrode PE1, the second pixel electrode PE2, and the third pixel electrode PE3 may be disposed on the fourth organic insulating layer OL4. The first pixel electrode PE1 may be electrically connected to the first thin film transistor TFT1 through the pixel circuit of the first sub-pixel PX1. The second pixel electrode PE2 may be electrically connected to the second thin film transistor TFT2 through the pixel circuit of the second sub-pixel PX2. The third pixel electrode PE3 may be electrically connected to the third thin film transistor TFT3 through the pixel circuit of the third sub-pixel PX3. Depending on a light emission scheme of the display device, each of the first to third pixel electrodes PE1, PE2, and PE3 may be formed by using a reflective material or a transmissive material. In embodiments, each of the first to third pixel electrodes PE1, PE2, and PE3 may be formed in a single-layer structure or a multilayer structure including a metal film, an alloy film, a metal nitride film, a conductive metal oxide film, and/or a transparent conductive material film.

Although not shown in the drawing, the pixel circuits disposed under the first to third pixel electrodes PE1, PE2, and PE3 may have mutually different types of step structures due to differences in arrangements and structures of the first to third pixel electrodes PE1, PE2, and PE3. Accordingly, although the first to third pixel electrodes PE1, PE2, and PE3 have been shown in the drawing as having flat surfaces, the first to third pixel electrodes PE1, PE2, and PE3 may have minute curves and inclinations, so that a reflective color band having a specific color may be caused by deviations of the curves and inclinations of the first to third pixel electrodes PE1, PE2, and PE3. (See FIGS. 6, 7A, and 7B)

However, according to the present embodiment, the embodiment may have an asymmetric structure in which the third organic insulating pattern OL3 overlaps the second pixel electrode PE2 and does not overlap the first and third pixel electrodes PE1 and PE3, and the third organic insulating pattern OL3 may serve to alleviate the curve and inclination of the second pixel electrode PE2, so that the reflective color band having the specific color may be prevented from occurring.

The pixel defining layer PDL may be disposed on the fourth organic insulating layer OL4 on which the first to third pixel electrodes PE1, PE2, and PE3 are disposed. The pixel defining layer PDL may be formed by using an organic material, an inorganic material, and the like. For example, the pixel defining layer PDL may be formed by using a photoresist, a polyacryl-based resin, a polyimide-based resin, an acryl-based resin, a silicone compound, and the like. In embodiments, the pixel defining layer PDL may be etched to form openings that partially expose the first to third pixel electrodes PE1, PE2, and PE3, respectively. An emission area and a non-emission area of the display device may be defined by the opening of the pixel defining layer PDL. For example, a portion in which the opening of the pixel defining layer PDL is located may correspond to the emission area, and the non-emission area may correspond to a portion adjacent to the opening of the pixel defining layer PDL.

The first to third light emitting layers EL1, EL2, and EL3 may be disposed on the first to third pixel electrodes PE1, PE2, and PE3 exposed through the openings of the pixel defining layer PDL, respectively. In addition, each of the first to third light emitting layers EL1, EL2, and EL3 may extend onto a side wall of the opening of the pixel defining layer PDL. In embodiments, each of the first to third light emitting layers EL1, EL2, and EL3 may have a multilayer structure including an organic emission layer EL, a hole injection layer HIL, a hole transport layer HTL, an electron transport layer ETL, an electron injection layer EIL, and the like. In another embodiment, the hole injection layer, the hole transport layer, the electron transport layer, and the electron injection layer, except for the organic emission layer, may be commonly formed to correspond to a plurality of pixels. The organic emission layers of the first to third light emitting layers EL1, EL2, and EL3 may be formed by using light emitting materials for generating different color lights such as a red light, a green light, and a blue light according to each of the pixels of the display device. According to other embodiments, each of the organic emission layers of the first to third light emitting layers EL1, EL2, and EL3 may have a structure formed by stacking a plurality of light emitting materials for implementing different color lights such as a red light, a green light, and a blue light to emit a white light. In this case, the above light emitting structures may be commonly formed to correspond to the pixels, and the pixels may be classified by the color filter layer CF.

The counter electrode CE may be disposed on the pixel defiling layer PDL and the first to third light emitting layers EL1, EL2, and EL3. Depending on the light emission scheme of the display device, the counter electrode CE may include a transmissive material or a reflective material. In embodiments, the counter electrode CE may also be formed in a single-layer structure or a multilayer structure including a metal film, an alloy film, a metal nitride film, a conductive metal oxide film, and/or a transparent conductive material film.

The thin film encapsulation layer TFE may be disposed on the counter electrode CE. The thin film encapsulation layer TFE, may prevent moisture and oxygen from penetrating from outside of the electronic device. The thin film encapsulation layer TFE, may include at least one organic layer and at least one inorganic layer. The at least one organic layer and the at least one inorganic layer may be alternately stacked on each other. For example, the thin film encapsulation layer TFE may include two inorganic layers and one organic layer disposed therebetween, but the embodiments are not limited thereto. In another embodiment, a sealing substrate may be provided instead of the thin film encapsulation layer to block outside air and moisture from penetrating into the display device.

The light blocking part BM and the color filter layer CF may be disposed on the thin film encapsulation layer TFE.

The light blocking part BM may include a material for blocking a light. The light blocking part BM may overlap the opening area OA of the inorganic insulating layer INO and the pixel defiling layer PDL.

The color filter layer CF may include red, green, and blue color filter layers corresponding to light emission colors of the first to third light emitting layers EL1, EL2, and EL3. When the light emitting layers EL1, EL2, and EL3 have different colors, the color filter layer CF may include color filter layers having colors corresponding to the colors of the light emitting layers. A low-temperature color filter that may be manufactured in a low temperature process of about 100° C. or less may be used as the color filter layer CF. The low-temperature color filter may be manufactured by using an organic material in which a curing process is performed by ultraviolet rays at a temperature of about 100° C. or less. In this case, the color filter layer CF may be directly formed on the thin film encapsulation layer TFE through the low temperature process. Accordingly, it is unnecessary to apply an additional polarization film to improve outdoor visibility.

Referring again to FIG. 4, in the bending area BA, the display device may include a base substrate 100, an inorganic insulating layer INO, a first organic insulating pattern OL1, an insulating layer 160, a second organic insulating layer OL2, a fourth conductive pattern CON4, a third organic insulating pattern OL3, a fourth organic insulating layer OL4, a pixel defiling layer PDL, and a thin film encapsulation layer TFE.

The base substrate 100 may include a first polyimide layer 101, a first barrier layer 102, a second polyimide layer 103, and a second barrier layer 104. The inorganic insulating layer INO may include a buffer layer 110, a gate insulating layer 120, a first inorganic insulating layer 130, a second inorganic insulating layer 140, and a third inorganic insulating layer 150.

A bending opening may be formed by partially removing the inorganic insulating layer INO, and the first organic insulating pattern OL1 may be disposed inside the bending opening. In other words, the bending opening may be formed through the third inorganic insulating layer 150, the second inorganic insulating layer 140, the first inorganic insulating layer 130, the gate insulating layer 120, the buffer layer 110, and the second bather layer 104, and the bending opening may be filled with the first organic insulating pattern OL1 and the second organic insulating layer OL2.

Figure 5:
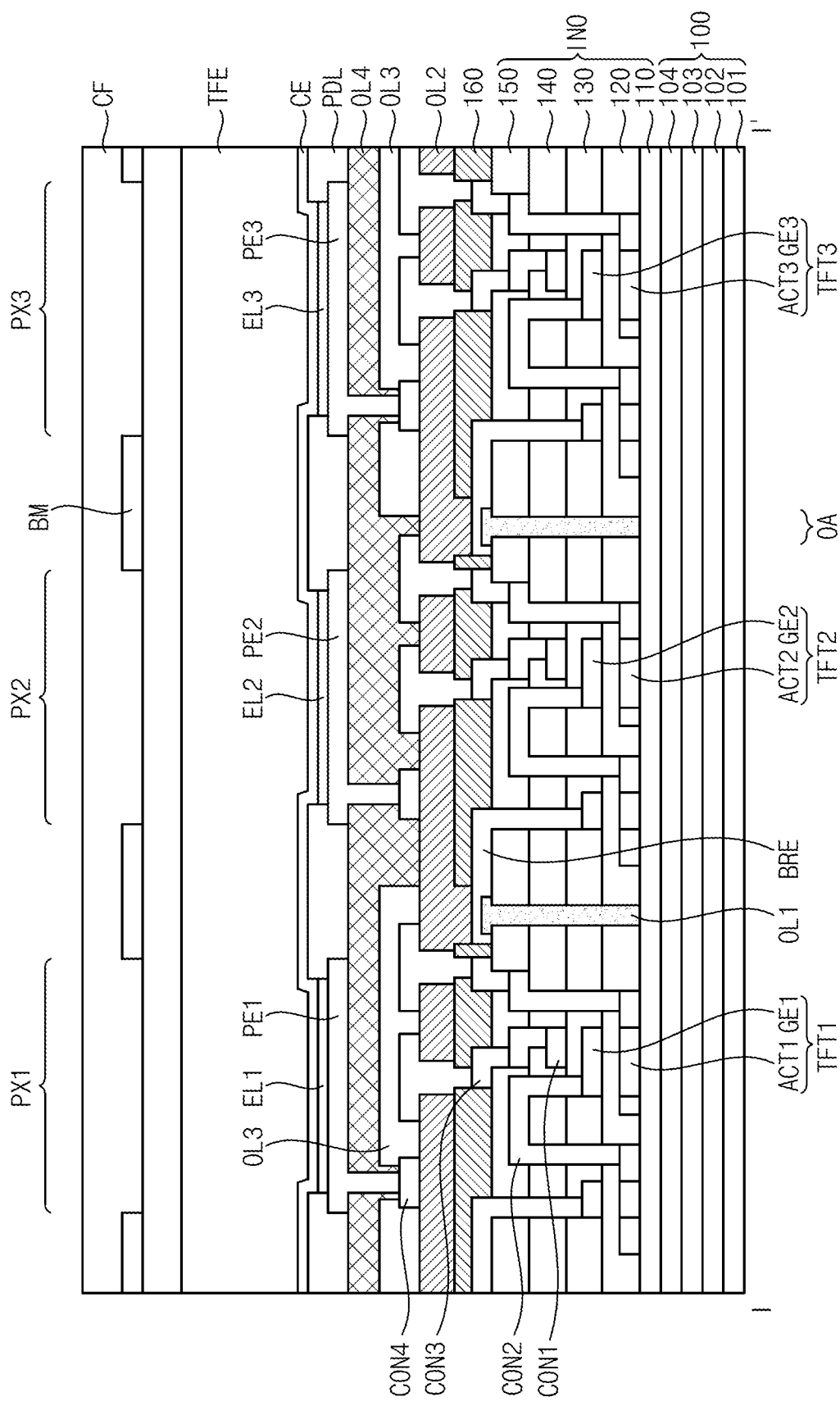
FIG. 5 is a cross-sectional view showing a display device according to embodiments of the present invention.

FIG. 5 is a cross-sectional view showing a display device according to embodiments of the present invention.

Referring to FIG. 5, the display device is substantially the same as the display device of FIGS. 1 to 4 except for a position where the third organic insulating pattern OL3 is formed. Therefore, redundant descriptions thereof will be omitted.

The display device may include a base substrate 100, a buffer layer 110, first to third active patterns ACT1, ACT2, and ACT3, a gate insulating layer 120, a gate electrode layer, a first inorganic insulating layer 130, a first conductive pattern CON1, a second inorganic insulating layer 140, a second conductive pattern CON2, a third inorganic insulating layer 150, a third conductive pattern CON3, a first organic insulating pattern OL1, an insulating layer 160, a fourth conductive pattern CON4, a second organic insulating layer OL2, a third organic insulating pattern OL3, a fourth organic insulating layer OL4, a first pixel electrode PE1, a second pixel electrode PE2, a third pixel electrode PE3, a pixel defiling layer PDL, a first light emitting layer EL1, a second light emitting layer EL2, a third light emitting layer EL3, a counter electrode CE, a thin film encapsulation layer TFE, a light blocking part BM, and a color filter layer CF.

In this case, the first sub-pixel PX1 in which the first pixel electrode PE1 is located may be a red sub-pixel, the second sub-pixel PX2 in which the second pixel electrode PE2 is located may be a green sub-pixel, and the third sub-pixel PX3 in which the third pixel electrode PE3 is located may be a blue sub-pixel.

Unlike the display device of FIGS. 1 to 4, the display device may be configured such that the third organic insulating pattern OL3 overlaps the first and third pixel electrodes PE1 and PE3 and does not overlap the second pixel electrode PE2.

Figure 6:
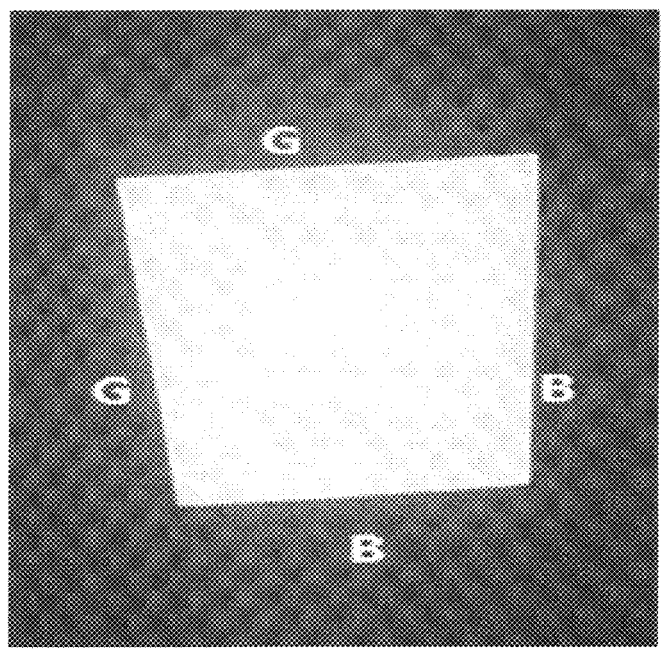
FIG. 6 is a diagram showing a reflective color band of a flexible display device when a configuration of the present invention is not applied.

FIG. 6 is a diagram showing a reflective color band of a flexible display device when a configuration of the present invention is not applied.

Referring to FIG. 6, in a case of a flexible display device to which the configuration of the present invention is not applied, as shown in the drawing, a reflective color band was observed. As shown in the drawing, when the flexible display device displays white, green reflective bands were observed on upper and left sides, and blue reflective bands were observed on lower and right sides, so that the flexible display device exhibited non-uniform reflective properties overall.

Although not shown, it was found that, when the configuration of the present invention is applied, the non-uniform reflective properties disappear, and a reflective color band having a specific color is not observed.

Figure 7A:
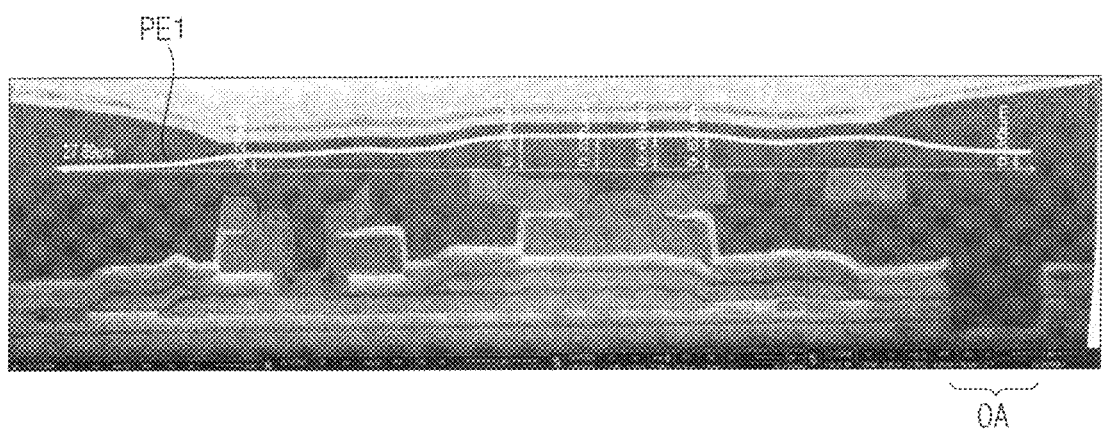
FIGS. 7A and 7B are scanning electron microscope (SEM) photographs showing sections of portions corresponding to a first sub-pixel and a second sub-pixel of a flexible display device when a configuration of the present invention is not applied.
Figure 7B:
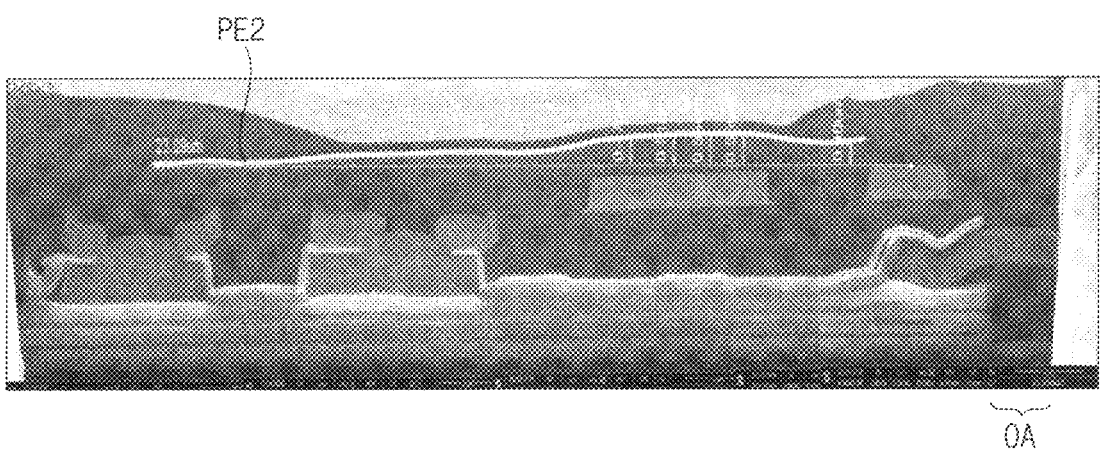

FIGS. 7A and 7B are scanning electron microscope (SEM) photographs showing sections of portions corresponding to a first sub-pixel and a second sub-pixel of a flexible display device when a configuration of the present invention is not applied.

According to FIG. 7A, it was found that a step is generated at a lower portion of a first pixel electrode PE1 due to a complex wire structure disposed at the lower portion of the first pixel electrode PE1. In addition, according to FIG. 7B, it was found that a step and an inclination of a lower portion of a second pixel electrode PE2 are different from the step and an inclination of the lower portion of the first pixel electrode PE1 overall due to a complex wire structure disposed at the lower portion of the second pixel electrode PE2 and a bridge electrode disposed in an opening area OA.

In other words, the wire structure under the pixel electrode may be complex, and deviations of steps and inclinations of lower portions of respective pixel electrodes of red, green, and blue sub-pixels may be caused by a structure of the bridge electrode or the like, so that a reflective color band having a specific color may be observed.

According to embodiments of the present invention, the display device may have an asymmetric structure in which a third organic insulating pattern is disposed under a pixel electrode corresponding to at least one sub-pixel, and the third organic insulating pattern is not disposed under a pixel electrode corresponding to at least one another sub-pixel, so that a reflective color band having a specific color may be prevented from occurring.

Figure 8:
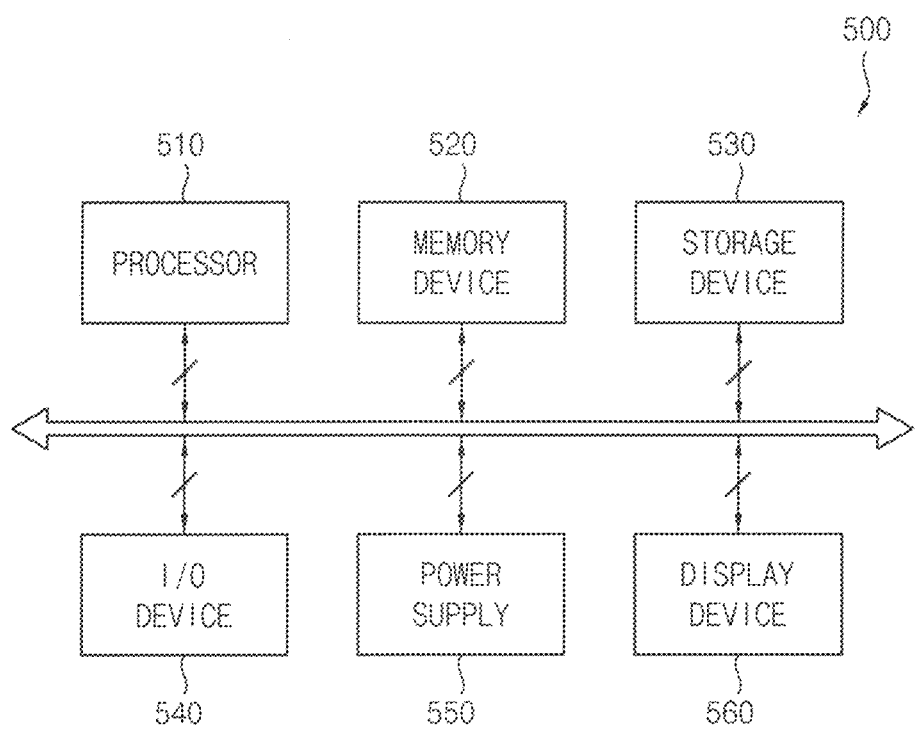
FIG. 8 is a block diagram showing an electronic device according to embodiments of the present invention.
Figure 9A:
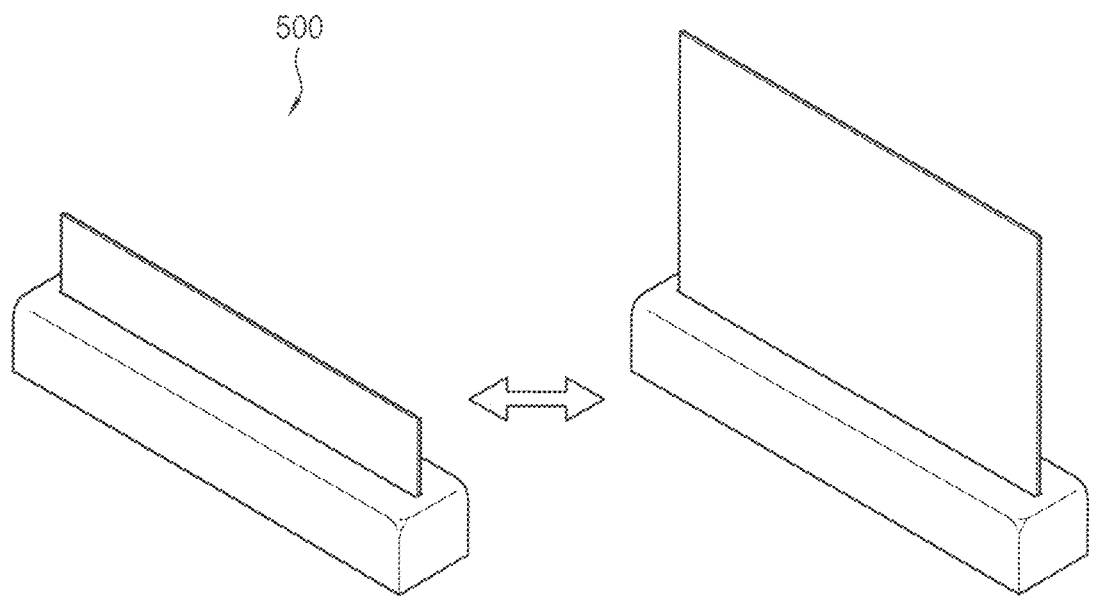
FIG. 9A is a diagram showing an example in which the electronic device of FIG. 8 is implemented as a television.
Figure 9B:
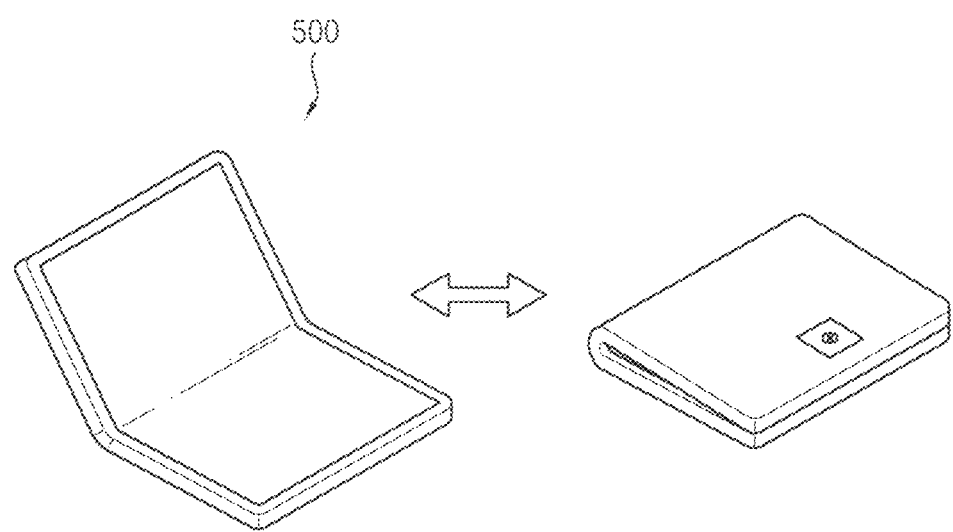
FIG. 9B is a diagram showing an example in which the electronic device of FIG. 8 is implemented as a smartphone.

FIG. 8 is a block diagram showing an electronic device according to embodiments of the present invention, FIG. 9A is a diagram showing an example in which the electronic device of FIG. 8 is implemented as a television, and FIG. 9B is a diagram showing an example in which the electronic device of FIG. 8 is implemented as a smartphone.

Referring to FIGS. 8 to 9B, the electronic device 500 may include a processor 510, a memory device 520, a storage device 530, an input/output (I/O) device 540, a power supply 550, and a display device 560. Here, the display device 560 may be the display device of FIG. 1. In addition, the electronic device 500 may further include a plurality of ports for communicating with a video card, a sound card, a memory card, a universal serial bus (USB) device, other electronic devices, and the like. In an embodiment, as illustrated in FIG. 9A, the electronic device 500 may be implemented as a television. In another embodiment, as illustrated in FIG. 9B, the electronic device 500 may be implemented as a smartphone. However, the electronic device 500 is not limited thereto. For example, the electronic device 500 may be implemented as a cellular phone, a video phone, a smart pad, a smartwatch, a tablet PC, a car navigation system, a computer monitor, a laptop, a head mounted display (HMD) device, and the like.

The processor 510 may perform various computing functions. The processor 510 may be a micro-processor, a central processing unit (CPU), an application processor (AP), and the like. The processor 510 may be coupled to other components via an address bus, a control bus, a data bus, and the like. Further, the processor 510 may be coupled to an extended bus such as a peripheral component interconnection (PCI) bus. The memory device 520 may store data for operations of the electronic device 500. For example, the memory device 520 may include a non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or a volatile memory device such as a dynamic random access memory (DRAM) device, a static random access memory (SRAM) device, a mobile DRAM device, and the like. The storage device 530 may include a solid state drive (SSD) device, a hard disk drive (HDD) device, a CD-ROM device, and the like. The I/O device 540 may include an input device such as a keyboard, a keypad, a mouse device, a touch-pad, a touch-screen, and the like and an output device such as a printer, a speaker, and the like. The power supply 550 may provide power for operations of the electronic device 500.

The display device 560 may be coupled to other components via the buses or other communication links. In some embodiments, the display device 560 may be included in the I/O device 540. As described above, the display device 560 may have an asymmetric structure in which a third organic insulating pattern is disposed under a pixel electrode corresponding to at least one sub-pixel, and the third organic insulating pattern is not disposed under a pixel electrode corresponding to at least one another sub-pixel, so that a reflective color band having a specific color may be prevented from occurring. In addition, an opening area for stress relaxation may be formed in an inorganic insulating layer, and the opening area may be filled with a layer including an organic insulating material, so that a crack or a tear may be prevented from being caused by stress in the inorganic insulating layer. However, since these are described above, duplicated description related thereto will not be repeated.

The present invention may be applied to an organic light emitting display device and an electronic device including the organic light emitting display device. For example, the present invention may be applied to a cellular phone, a smartphone, a video phone, a smart pad, a smartwatch, a tablet PC, a car navigation system, a television, a computer monitor, a laptop, a head mounted display (HMD) apparatus, an MP3 player, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

The invention claimed is:

1. A display device, comprising:
    a flexible base substrate;
    a first pattern disposed on the flexible base substrate
    a second active pattern disposed on the flexible base substrate;
    an inorganic insulating layer disposed on the first and second active patterns and defining an opening area;
    a first organic insulating pattern disposed inside the opening area;
    a bridge electrode disposed on the first organic insulating pattern;
    a second organic insulating layer disposed on the bridge electrode;
    a fourth organic insulating layer disposed on the second organic insulating layer;
    a first pixel disposed on the fourth organic insulating layer and electrically connected to the first active pattern;
    a second pixel disposed on the fourth organic insulating layer and electrically connected to the second active pattern;
    a third organic insulating pattern disposed between the second organic insulating layer and the fourth organic insulating layer, directly contacting the fourth organic insulating layer, overlapping the second pixel electrode, and not overlapping the first pixel electrode.

2. The display device of claim 1, further comprising:
a third active pattern disposed on the flexible base substrate; and
a third pixel electrode disposed on the fourth organic insulating layer and electrically connected to the third active pattern,
wherein the third organic insulating pattern does not overlap the third pixel electrode.

3. The display device of claim 2, wherein the first pixel electrode corresponds to a red sub-pixel, the second pixel electrode corresponds to a green sub-pixel, and the third pixel electrode corresponds to a blue sub-pixel.

4. The display device of claim 1, further comprising:
a third active pattern disposed on the flexible base substrate; and
a third pixel electrode disposed on the fourth organic insulating layer and electrically connected to the third active pattern,
wherein the third organic insulating pattern overlaps the third pixel electrode.

5. The display device of claim 4, wherein the first pixel electrode corresponds to a green sub-pixel, the second pixel electrode corresponds to a red sub-pixel, and the third pixel electrode corresponds to a blue sub-pixel.

6. The display device of claim 1, wherein, when viewed in a plan view, the inorganic insulating layer is partitioned by the opening area to correspond to a plurality of sub-pixels.

7. The display device of claim 6, wherein, when viewed in the plan view, the opening area has a lattice shape.

8. The display device of claim 1, further comprising:
a pixel defining layer disposed on the fourth organic insulating layer;
a light emitting layer disposed on the first pixel electrode; and
a counter electrode disposed on the light emitting layer.

9. The display device of claim 8, further comprising:
a thin film encapsulation layer disposed on the counter electrode; and
a color filter layer disposed on the thin film encapsulation layer.

10. The display device of claim 1, wherein the first pixel electrode and the first active pattern are included in a pixel circuit of a first sub-pixel,
wherein the second pixel electrode and the second active pattern are included in a pixel circuit of a second sub-pixel, and
wherein the bridge electrode electrically connects the first sub-pixel and the second sub-pixel to each other.

11. The display device of claim 1, wherein the inorganic insulating layer comprises:
a buffer layer disposed on the flexible base substrate;
a gate insulating layer disposed on the buffer layer; and
a plurality of inorganic insulating layers disposed on the gate insulating layer.

12. The display device of claim 11, further comprising:
a first gate electrode disposed on the gate insulating layer and overlapping the first active pattern;
a second gate electrode disposed on the gate insulating layer and overlapping the second active pattern;
a first inorganic insulating layer disposed on the gate insulating layer;
a first conductive pattern disposed on the first inorganic insulating layer;
a second inorganic insulating layer disposed on the first conductive pattern;
a second conductive pattern disposed on the second inorganic insulating layer;
a third inorganic insulating layer disposed on the second conductive pattern;
a third conductive pattern disposed on the third inorganic insulating layer;
an insulating layer disposed on the third conductive pattern; and
a fourth conductive pattern disposed on the insulating layer,
wherein the first to third inorganic insulating layers are included in the inorganic insulating layer, and
wherein the third organic insulating pattern and the fourth organic insulating layer are disposed between the fourth conductive pattern and the second pixel electrode.

13. A display device 2, comprising:
a flexible base substrate;
a first active pattern disposed on the flexible base substrate;
a second active pattern disposed on the flexible base substrate;
an inorganic insulating layer disposed on the first and second active patterns and defining an opening area;
a first organic insulating pattern disposed inside the opening area;
a bridge electrode disposed on the first organic insulating pattern;
a second organic insulating layer disposed on the bridge electrode;
a fourth organic insulating layer disposed on the second organic insulating layer;
a first pixel electrode disposed on the fourth organic insulating layer and electrically connected to the first active pattern;
a second pixel electrode disposed on the fourth organic insulating layer and electrically connected to the second active pattern;
a third organic insulating pattern disposed between the second organic insulating layer and the fourth organic insulating layer, overlapping the second pixel electrode, and not overlapping the first pixel electrode,
wherein the inorganic insulating layer comprises:
a buffer layer disposed on the flexible base substrate;
a gate insulating layer disposed on the buffer layer; and
a plurality of inorganic insulating layers disposed on the gate insulating layer;
a first gate electrode disposed on the gate insulating layer and overlapping the first active pattern;
a second gate electrode disposed on the gate insulating layer and overlapping the second active pattern;
a first inorganic insulating layer disposed on the gate insulating layer;
a first conductive pattern disposed on the first inorganic insulating layer;
a second inorganic insulating layer disposed on the first conductive pattern;
a second conductive pattern disposed on the second inorganic insulating layer;
a third inorganic insulating layer disposed on the second conductive pattern;
a third conductive pattern disposed on the third inorganic insulating layer;
an insulating layer disposed on the third conductive pattern; and
a fourth conductive pattern disposed on the insulating layer, wherein the first to third inorganic insulating layers are included in the inorganic insulating layer, wherein the third organic insulating pattern and the fourth organic insulating layer are disposed between the fourth conductive pattern and the second pixel electrode, and wherein the bridge electrode is included in the third conductive pattern.

14. The display device of claim 1, wherein the third organic insulating pattern includes a siloxane-based resin, and wherein the fourth organic insulating layer includes a polyimide-based resin.

15. The display device of claim 1, wherein the third organic insulating pattern and the fourth organic insulating layer include a same material.

16. The display device of claim 1, further comprising:
a light blocking part overlapping the opening area of the inorganic insulating layer.

17. The display device of claim 1, further comprising:
an insulating layer disposed between the second organic insulating layer and the inorganic insulating layer, covering the bridge electrode, and including an organic insulating material.

18. The display device of claim 1, wherein the flexible base substrate includes a display area in which an image is displayed and a peripheral area surrounding the display area, and wherein a bending opening is formed in the peripheral area by partially removing the inorganic insulating layer, and the first organic insulating pattern is disposed inside the bending opening.

19. A display device, comprising:
a flexible base substrate,
a first sub-pixel, a second sub-pixel, and a third sub-pixel, wherein the first to third sub-pixels emit different color lights;
a first pixel circuit, a second pixel circuit, and a third pixel circuit disposed on the flexible base substrate;
a first pixel electrode electrically connected to the first pixel circuit, a second pixel electrode electrically connected to the second pixel circuit, and a third pixel electrode electrically connected to the third pixel circuit; and
a plurality of inorganic insulating layers and a plurality of organic insulating layers, which are disposed between the flexible base substrate and the first to third pixel electrodes,
wherein, when viewed in a plan view, an opening area, which is an area in which the plurality of inorganic insulating layers is not formed, is formed between the first to third pixel electrodes, and the plurality of organic insulating layers is disposed inside the opening area, and
wherein a number of the organic insulating layers disposed between the second pixel electrode and the flexible base substrate is different from a number of the organic insulating layers disposed between the first or third pixel electrode and the flexible base substrate.

20. The display device of claim 19, further comprising:
a bridge electrode overlapping the opening area,
wherein the bridge electrode electrically connects two adjacent pixel circuits to each other.

* * * * *